United States Patent
Tajitsu et al.

(10) Patent No.: US 8,183,751 B2
(45) Date of Patent: May 22, 2012

(54) PIEZOELECTRIC ELEMENT AND AUDIO DEVICE

(75) Inventors: Yoshiro Tajitsu, Osaka (JP); Masamichi Andoh, Kyoto-fu (JP); Satoshi Kuretake, Kyoto-fu (JP)

(73) Assignees: A School Corporation Kansai University, Suita-Shi (JP); Murata Manufacturing Co., Ltd., Nagaokakyo-Shi (JP)

(*) Notice: Subject to any disclaimer, the term of this patent is extended or adjusted under 35 U.S.C. 154(b) by 37 days.

(21) Appl. No.: 12/943,431

(22) Filed: Nov. 10, 2010

(65) Prior Publication Data

US 2011/0109204 A1     May 12, 2011

Related U.S. Application Data

(63) Continuation of application No. PCT/JP2009/057113, filed on Apr. 7, 2009.

(30) Foreign Application Priority Data

May 12, 2008    (JP) .................................. 2008-124203

(51) Int. Cl.
*H01L 41/193*    (2006.01)
*H01L 41/047*    (2006.01)

(52) U.S. Cl. ....................... 310/800; 310/328; 310/363

(58) Field of Classification Search .................. 310/328, 310/363, 800
See application file for complete search history.

(56) References Cited

U.S. PATENT DOCUMENTS

| | | | |
|---|---|---|---|
| 5,288,551 A | 2/1994 | Sato et al. | |
| 5,321,332 A * | 6/1994 | Toda | 310/322 |
| 7,436,099 B2 * | 10/2008 | Pei et al. | 310/311 |
| 2011/0062829 A1 * | 3/2011 | Andoh et al. | 310/363 |

FOREIGN PATENT DOCUMENTS

| | | |
|---|---|---|
| JP | 5-102548 A | 4/1993 |
| JP | 05-152638 A | 6/1993 |
| JP | 2005-213376 A | 8/2005 |

* cited by examiner

*Primary Examiner* — Thomas M Dougherty
(74) *Attorney, Agent, or Firm* — Dickstein Shapiro LLP

(57) ABSTRACT

A piezoelectric element including a plurality of stacked piezoelectric sheets, wherein the stretching axis of a first piezoelectric sheet and the stretching axis of a second piezoelectric sheet of the plurality of piezoelectric sheets are oriented in different directions from each other. Preferably, the stretching axis of the first piezoelectric sheet and the stretching axis of the second piezoelectric sheet are intersected at an angle of 90 degrees.

12 Claims, 12 Drawing Sheets

PIEZOELECTRIC ELEMENT AND AUDIO DEVICE

CROSS REFERENCE TO RELATED APPLICATIONS

The present application is a continuation of International Application No. PCT/JP2009/057113, filed Apr. 7, 2009, which claims priority to Japanese Patent Application No. JP2008-124203, filed May 12, 2008, the entire contents of each of these applications being incorporated herein by reference in their entirety.

TECHNICAL FIELD

The present invention relates to a piezoelectric element and an audio device, and in particular, to a piezoelectric element including a piezoelectric sheet made of a polymer, which exhibits piezoelectricity when it is stretched, such as a polylactic acid, and an audio device configured with the use of piezoelectric element.

BACKGROUND ART

Japanese Patent Application Laid-Open No. 5-152638 (Patent Document 1), for example, discloses a piezoelectric sheet with a piezoelectric constant $d_{14}$, which can be obtained by stretching a molded product of a polylactic acid. More specifically, as shown in FIG. 16, assuming that a piezoelectric sheet 11 made of a polylactic acid has electrodes formed on upper and lower surfaces in the figure and is stretched in a "3" axis direction, stain will be produced in a "4" axis direction which is the rotating direction of "1" axis, when an electric field is applied in the direction of the "1" axis which is a normal direction with respect to the electrode surfaces.

This piezoelectric sheet made of a polylactic acid is used to provide a unimorph or bimorph structure, thereby allowing piezoelectric elements such as piezoelectric vibrators to be obtained for use in speakers, microphones, etc. While Patent Document 1 discloses these applications, it merely mentions that "when the molded object stretched is a film, the film is cut into an appropriate size to serve as a product" (section [0018]) and includes no specific disclosure on the method for constituting the piezoelectric elements.

On the other hand, the stretched sheet has the problem of tendency to tear along the stretching direction. In this case, if biaxial stretching is carried out, the tendency to tear will be alleviated to some extent. It is to be noted that the substantially uniaxial stretching by four to six times has to be obtained in order to keep high piezoelectricity. Therefore, in the case of biaxial stretching in the X axis direction and the Y axis direction, the ratio of the stretching in the Y axis direction to the stretching in the X axis direction has to be set to 1:4 to 1:6. For example, when biaxial stretching is to be carried out in the X axis direction, the stretching by 8 times or more has to be carried out in the Y axis direction.

However, even when the biaxial stretching is carried out as described above, the problem of the tendency to tear will still remain while the problem is alleviated to some extent. In particular, in the case of using the piezoelectric sheet for actuators, speakers, etc., the problem of the tendency to tear is serious because the piezoelectric sheet always has relatively high stress caused.

Further, this problem is encountered not only for piezoelectric sheets made of a polylactic acid, but also generally for piezoelectric sheets which have a main constituent made of a helical polymer with a chiral molecule as a unit and exhibit piezoelectricity when they are stretched.

Patent Document 1: Japanese Patent Application Laid-Open No. 5-152638

SUMMARY OF THE INVENTION

Therefore, an object of the present invention is to provide a piezoelectric element including a piezoelectric sheet, which can solve the problem as described above, and an audio device configured with the use of the piezoelectric element.

The present invention is directed to a piezoelectric element including a plurality of stacked piezoelectric sheets having a predetermined stretching axis and having a main constituent including a helical polymer with a chiral molecule as a unit, and electrodes formed on both principal surfaces of each of the piezoelectric sheets, In order to solve the above technical problem, the present invention has a feature in that at least one piezoelectric sheet of the plurality of piezoelectric sheets is different from the other piezoelectric sheet in the direction of the stretching axis.

It is to be noted that while the "stretching axis" refers to the axis oriented in the direction of the stretching in the case of uniaxial stretching, the "stretching axis" refers to the axis oriented in the direction of the stretching with the maximum stretch ratio in the case of stretching in multiple directions, as in the case of biaxial stretching.

In the piezoelectric element according to the present invention, it is more preferable that the stretching axis of at least one piezoelectric sheet of the plurality of piezoelectric sheets forms an angle of 90 degrees with the stretching axis of the other piezoelectric sheet. It is preferable to form an angle close to 90 degrees as much as possible even if the angle is other than 90 degrees.

Typically, the piezoelectric sheets are rectangular. In this case, preferably one side of the piezoelectric sheet forms an angle of greater than 0 degrees and less than 90 degrees with the stretching axis, more preferably an angle of 25 degrees or more and 65 degrees or less, and most preferably an angle of 45 degrees.

According to a first preferred aspect, in the piezoelectric element according to the present invention, the plurality of piezoelectric sheets include first and second piezoelectric sheets which are adjacent to each other with respect to the stacking direction and different from each other in the direction of the stretching axis, and an insulating layer is formed between the first piezoelectric sheet and the second piezoelectric sheet in order to electrically isolate the electrode formed on the principal surface of the first piezoelectric sheet and the electrode formed on the principal surface of the second piezoelectric sheet from each other.

According to a second preferred aspect, in the piezoelectric element according to the present invention, the plurality of piezoelectric sheets include a first piezoelectric sheet with the stretching axis oriented in a first direction and a second piezoelectric sheet with the stretching axis oriented in a second direction different from the first direction, first and second intermediate laminates are configured by alternately stacking the first piezoelectric sheet and the second piezoelectric sheet. The first and second intermediate laminates are stacked in such a way that the first piezoelectric sheets or the second piezoelectric sheets are adjacent to each other.

The helical polymer constituting the piezoelectric sheets is preferably a polylactic acid.

The electrodes preferably contain, as their main constituent, an indium tin oxide, an indium oxide-zinc oxide, or a zinc oxide. Alternatively, the electrodes preferably contain, as their main constituent, a polythiophene.

The present invention is also directed to an audio device including the piezoelectric element according to the present invention as described above.

In the piezoelectric element according to the present invention, at least one piezoelectric sheet of the plurality of piezoelectric sheets is different from the other piezoelectric sheet in the direction of the stretching axis, and the strength of a piezoelectric sheet in a direction along which the piezoelectric sheet tends to tear is thus reinforced by the other piezoelectric sheet, thereby increasing the strength of the plurality of piezoelectric sheets as a laminate. In particular, when the stretching axis of at least one piezoelectric sheet forms an angle of 90 degrees with the stretching axis of the other piezoelectric sheet, the maximum strength can be obtained.

When the piezoelectric sheet is rectangular, and when one side of the piezoelectric sheet forms an angle of greater than 0 degrees and less than 90 degrees with the stretching axis, the amplitude in the case of applying an electric field can be dramatically increased as compared with the case with the angle of 0 degrees or 90 degrees. More definitely, when one side of the piezoelectric sheet forms an angle of 25 degrees or more and 65 degrees or less with the stretching axis, a higher amplitude can be obtained, and further, when one side of the piezoelectric sheet forms an angle of 45 degrees, the maximum amplitude can be obtained.

When the plurality of piezoelectric sheets include first and second piezoelectric sheets which are adjacent to each other with respect to the stacking direction and different from each other in the direction of the stretching axis, and when an insulating layer is formed between the first piezoelectric sheet and the second piezoelectric sheet in order to electrically isolate the electrode formed on the principal surface of the first piezoelectric sheet and the electrode formed on the principal surface of the second piezoelectric sheet from each other, a piezoelectric element can be configured by simply stacking the two piezoelectric sheets of the first and second dielectric sheets.

When the plurality of piezoelectric sheets include a first piezoelectric sheet with the stretching axis oriented in a first direction and a second piezoelectric sheet with the stretching axis oriented in a second direction different from the first direction, when first and second intermediate laminates are configured by alternately stacking the first piezoelectric sheet and the second piezoelectric sheet, and when the first and second intermediate laminates are stacked in such a way that the first piezoelectric sheets or the second piezoelectric sheets are adjacent to each other, the electric field intensity onto each of the piezoelectric sheets can be increased without increasing the applied voltage, thereby allowing the strain forces of the piezoelectric sheets themselves to be increased and allowing the amounts of displacement thereof to be increased.

The use of a polylactic acid as a helical polymer constituting the piezoelectric sheets allows piezoelectric sheets with excellent transparency to be obtained. In addition, the polylactic acid can achieve stable piezoelectric characteristics, and provide piezoelectric elements in an inexpensive way. Furthermore, the polylactic acid is also preferable in terms of protection of the global environment, because the polylactic acid is carbon-neutral and biodegradable.

When the electrodes contain, as their main constituent, an indium tin oxide, an indium oxide-zinc oxide, or a zinc oxide, the piezoelectric element can be made transparent as long as the piezoelectric sheets have transparency. In particular, the use of the polylactic acid for the piezoelectric sheets makes it possible to make the piezoelectric element almost completely transparent, because the polylactic acid has an extremely high degree of transparency.

When the electrodes contain, as their main constituent, a polythiophene, the polythiophene allows deformations or vibrations of the piezoelectric sheets to be prevented from being substantially inhibited, because the polythiophene is a polymer with softness. In addition, the electrodes containing the polythiophene as their main constituent require no cumbersome and costly steps such as sputtering, and can be formed in an inexpensive way through a simple step such as simple coating.

When the piezoelectric element according to the present invention is used to constitute an audio device, a transparent speaker, for example, can be configured. This type of speaker can be placed even on the surface of a display without blocking a line of vision.

BRIEF EXPLANATION OF THE DRAWINGS

FIG. 1(a) is a plan view, FIG. 1(b) is a front view, and FIG. 1(c) is a cross-sectional view illustrating an enlarged section C of FIG. 1(b).

FIG. 6(a) is a plan view, and FIG. 6(b) is an enlarged cross-sectional view.

FIG. 8(a) is a plan view, and FIG. 8(b) is an enlarged cross-sectional view.

DETAILED DESCRIPTION OF THE INVENTION

Figure 16:
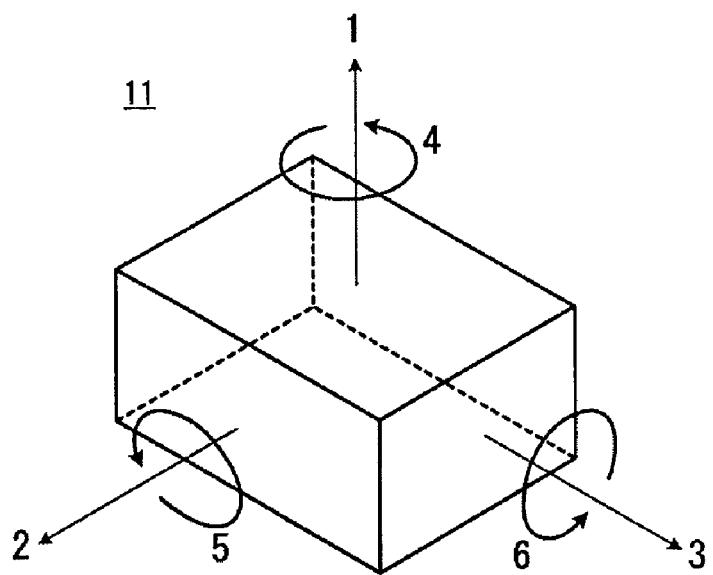
FIG. 16 is a diagram for explaining the relationship among the stretching axis direction, electric field direction, and strain direction in a piezoelectric sheet 11 made of a polylactic acid.
Figure 17:
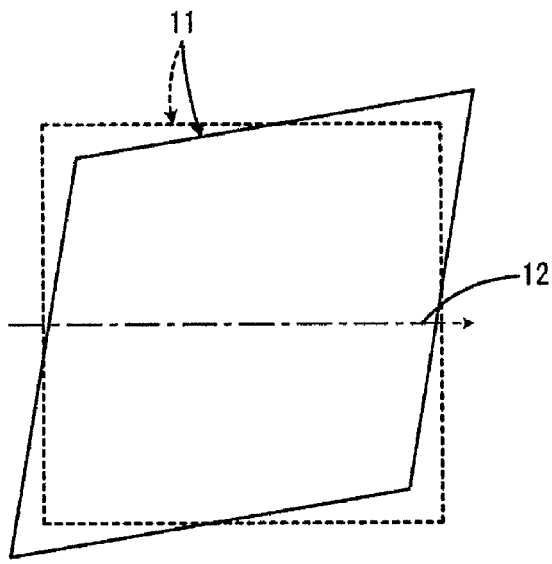
FIG. 17 is a plan view illustrating a deformed mode of the piezoelectric sheet 11 shown in FIG. 16 in the case of applying an electric field, in a rectangular shape cut out with the direction of one side of the piezoelectric element 11 corresponding to the direction of a stretching axis 12 thereof.

The piezoelectric sheet 11 with the piezoelectric constant $d_{14}$, shown in FIG. 16, is shown in a plan view of FIG. 17, in a rectangular shape cut out with the direction of one side of the piezoelectric element 11 corresponding to the direction of a stretching axis 12 thereof. When a voltage is applied so as to keep an electrode (not shown) on a front principal surface, with respect to the plane of paper, of the piezoelectric sheet 12 shown in FIG. 17 at, for example, 0 V, and keep an electrode (not shown) of a back principal surface with respect to the plane of paper at, for example, 10 V, the piezoelectric sheet 12 is deformed from the original state indicated by a dashed line to a state indicated by a solid line in FIG. 17.

Figure 18:
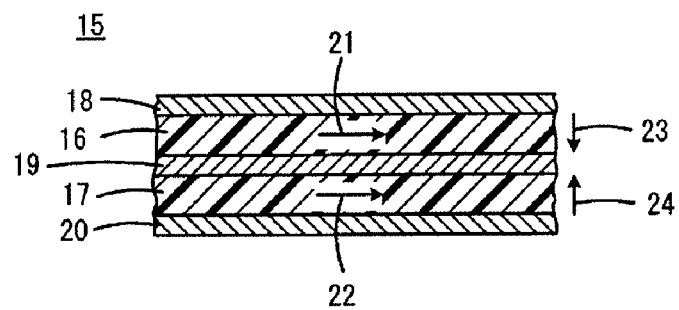
FIG. 18 is an enlarged cross-sectional view illustrating a portion of a bimorph type piezoelectric element 15 which has a structure of two attached piezoelectric sheets 11 as shown in FIG. 17.

FIG. 18 is a cross-sectional view illustrating a portion of a bimorph type piezoelectric element 15 configured by stacking two piezoelectric sheets as described above.

Referring to FIG. 18, the bimorph type piezoelectric element 15 has a structure of two piezoelectric sheets 16 and 17 attached, with an electrode 18 formed on the outward principal surface of the piezoelectric sheet 16, an electrode 19 formed on the respective inward principal surfaces of the piezoelectric sheets 16 and 17 between the piezoelectric sheets 16 and 17, and an electrode 20 formed on the outward principal surface of the piezoelectric sheet 17. It is to be noted that while the thicknesses of the electrodes 18 to 20 are quite small actually as compared with the thicknesses of the piezoelectric sheets 16 and 17, the electrodes 18 to 20 are shown exaggeratingly in FIG. 18.

The respective stretching axes 21 and 22 of the two piezoelectric sheets 16 and 17 are oriented in the same direction as each other. In this regard, the bimorph type piezoelectric element 15 shown in FIG. 18 is intended to serve as a reference example outside the scope of the present invention.

For example, when a relatively plus electric potential (for example, 10 V) is applied to the electrodes 18 and 20 whereas a relatively minus electric potential (for example, 0 V) is applied to the electrode 19, an electric field 23 applied to the piezoelectric sheet 16 is oppositely oriented with respect to an electric field 24 applied to the piezoelectric sheet 17, and as seen with a predetermined direction as a standard, the piezoelectric sheets 16 and 17 behave in such a way that one of the piezoelectric sheets 16 and 17 stretches whereas the other contracts.

Figure 19:
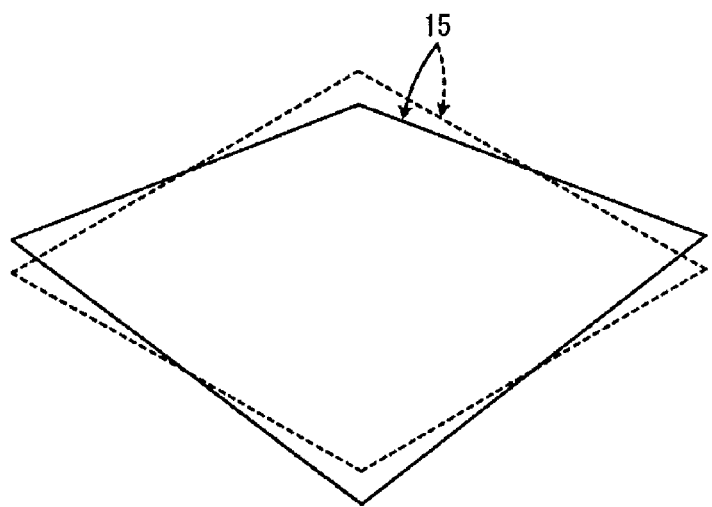
FIG. 19 is a perspective view illustrating a deformed mode of the bimorph type piezoelectric element 15 shown in FIG. 18 in the case of applying an electric field.
Figure 20:
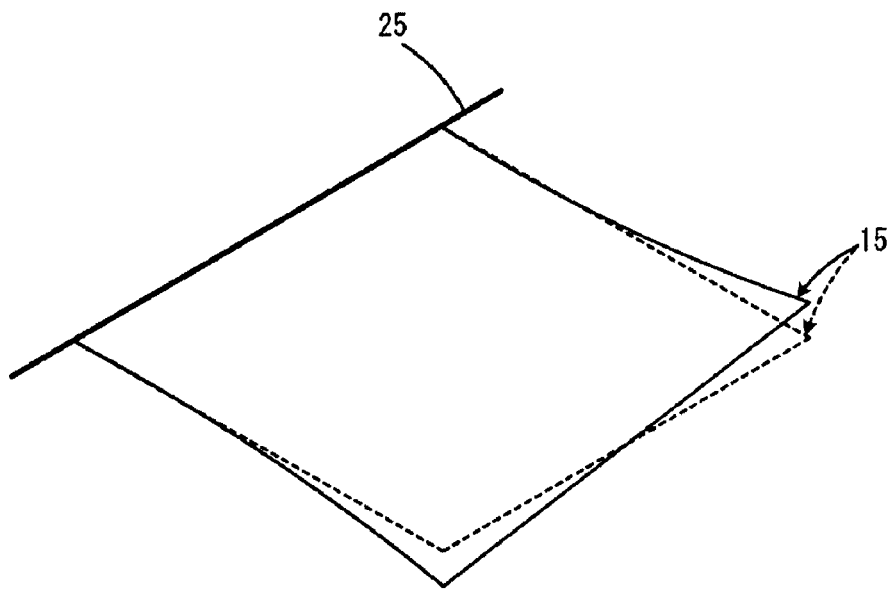
FIG. 20 is a perspective view illustrating a deformed mode of the bimorph type piezoelectric element 15 shown in FIG. 19 in the case of applying an electric field, with one side of the bimorph type piezoelectric element 15 as a fixed end 25.

As a result, a deformation is caused as shown in FIG. 19. In this condition, when the bimorph type piezoelectric element 15 is fixed with one side of the bimorph type piezoelectric element 15 as a fixed end 25, the bimorph type piezoelectric element 15 will cause a deformation as shown in FIG. 20. Then, when an alternating current voltage is applied for the electric fields 23 and 24, the bimorph type piezoelectric element 15 will vibrate.

However, the vibration in this mode is not preferable as bimorph vibration, and exhibits a small amount of displacement, because the amount of displacement is substantially 0 in a central portion of the side of the bimorph type piezoelectric element 15 opposed to the fixed end 25.

In addition, while the electrodes 18 to 20 are simple in structure in the bimorph type piezoelectric element 15, the respective stretching axes 21 and 22 of the two piezoelectric sheets 16 and 17 are oriented in the same direction as each other as described above, and the bimorph type piezoelectric element 15 thus has a problem in that the piezoelectric sheets tend to tear along the stretching axes.

These problems are solved by a bimorph type piezoelectric element described below.

Figure 1A:
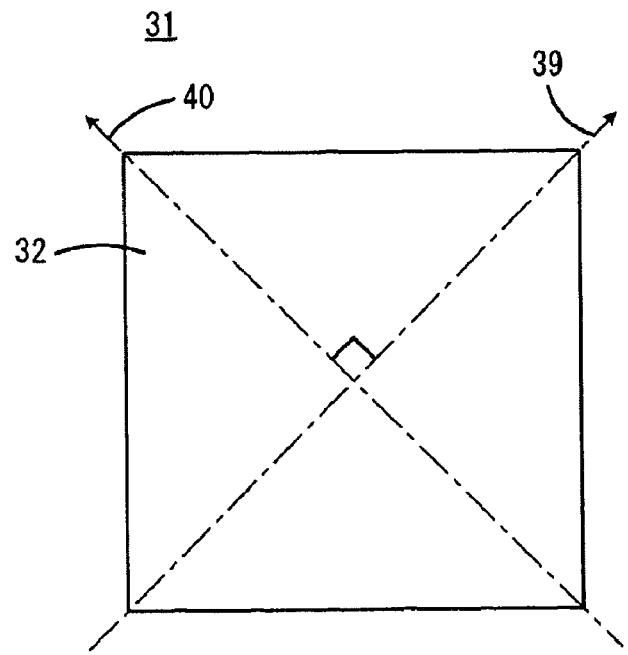
FIGS. 1(a)-1(c) show a bimorph type piezoelectric element 31 as a piezoelectric element according to a first embodiment of the present invention, where
Figure 1B:
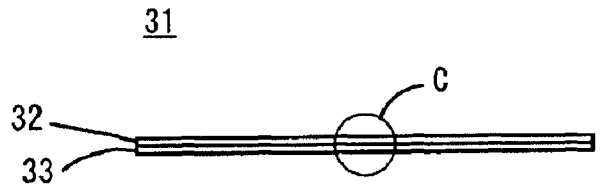
Figure 1C:
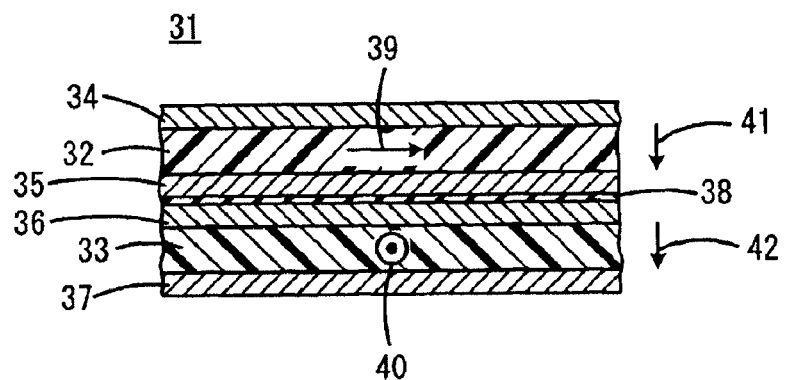

FIGS. 1(a)-1(c) show a bimorph type piezoelectric element 31 as a piezoelectric element according to a first embodiment of the present invention, where FIG. 1(a) is a plan view, FIG. 1(b) is a front view, and FIG. 1(c) is a cross-sectional view illustrating an enlarged section C of FIG. 1(b).

The bimorph type piezoelectric element 31 has a structure of two piezoelectric sheets 32 and 33 attached, which are each made of a polylactic acid. As shown in FIG. 1(c), an electrode 34 is formed on the outward principal surface of the piezoelectric sheet 32, whereas an electrode 35 is formed on the inward principal surface of the piezoelectric sheet 32. In addition, an electrode 36 is formed on the inward principal surface of the piezoelectric sheet 33, whereas an electrode 37 is formed on the outward principal surface of the piezoelectric sheet 33. In addition, the electrode 35 and the electrode 36 are attached to each other so as to be electrically isolated from each other with an insulating layer 38 interposed therebetween. It is to be noted that while the respective thicknesses of the electrodes 34 to 37 and insulating layer 38 are quite small actually as compared with the thicknesses of the piezoelectric sheets 32 and 33, the electrodes 34 to 37 and insulating layer 38 are shown exaggeratingly in FIG. 1(c).

The piezoelectric sheets 32 and 33 made of a polylactic acid as described above make it possible to provide stable piezoelectric characteristics and excellent transparency for the piezoelectric sheets 32 and 33. However, if these advantages are not particularly desired, a helical polymer containing a main constituent with a chiral molecule as a unit, other than the polylactic acid, may be used as the material for the dielectric sheets 32 and 33.

It is to be noted that polymers from a monomer with chirality (a monomer involving an enantiomer) do not always have a helical structure. In the case of biological polymers, one of polymers with enantiomerism is referred to as an L isomer, whereas the other is referred to as a D isomer. When the L isomer provides a helical polymer, the D isomer also provides a helical polymer, and the helical directions are opposite to each other. A polymer of a mixture of a polymer from the L isomer and a polymer from the D isomer exhibits neither optical rotation nor piezoelectricity, because the polymers are reversed with each other.

Even in the case of a monomer without chirality, as long as a polymer achieved by the polymerization of the monomer has a helical structure, the polymer has chirality. A monomer of glutamic acid or lactic acid has an asymmetric carbon, and thus has chirality, and further provides a helical polymer (chiral polymer). In the process of synthesis of polylactic acid, a poly L-lactic acid is synthesized through the action of microorganisms from starch. Therefore, it is a poly L-lactic acid (PLLA =Poly-L-Lactic-Acid) that is normally handled.

The electrodes 34 to 37 are preferably made of a material containing as its main constituent an indium tin oxide, an indium oxide-zinc oxide, or a zinc oxide. Since these materials have transparency, the bimorph type piezoelectric element 31 can be provided with transparency as long as the piezoelectric sheets 32 and 33 have transparency. In particular, when the piezoelectric sheets 32 and 33 are made of a polylactic acid, the bimorph type piezoelectric element 31 can provide a high degree of transparency.

The electrodes 34 to 37 preferably contain polythiophene as its main constituent. The polythiophene allows, because of its softness, deformations or vibrations of the piezoelectric sheets 32 and 33 to be prevented from being substantially inhibited.

For the formation of the electrodes 34 to 37 described above, simple coating can be applied in the case of using an organic material, sputtering can be applied in the case of using a zinc oxide or the like, or vapor deposition, sputtering, plating, bonding of a thin film, etc. can be applied in the case of a metal.

The insulating layer 38 is preferably made of a transparent and flexible resin. For example, an epoxy resin, a silicone resin, a styrene-butadiene copolymer, etc. can be used. It is to be noted that even if the resin itself constituting the insulating layer 38 has a low degree of transparency, the insulating layer 38 can be, because of its extreme thinness, provided with substantial transparency, but the resin itself constituting the insulating layer 38 preferably has a high degree of transparency.

In FIGS. 1(a) and (c), a stretching axis 39 of the piezoelectric sheet 32 and a stretching axis 40 of the piezoelectric sheet 33 are shown. These stretching axes 39 and 40 refer to the axes oriented in the stretching directions provided to the piezoelectric sheets 32 and 33, and refer to the axes oriented in the directions of stretching with the maximum stretch ratios in the case of stretching in multiple directions, for example, as in the case of biaxial stretching.

The bimorph type piezoelectric element 31 according to the embodiment of the present invention is characterized in that the stretching axis 39 of the piezoelectric sheet 32 and the stretching axis 40 of the piezoelectric sheet 33 are different in direction from each other. In particular, in this embodiment, the stretching axis 39 of the piezoelectric sheet 32 forms an angle of 90 degrees with the stretching axis 40 of the piezoelectric sheet 33. This allows the bimorph type piezoelectric element 31 to produce the maximum strength against the tendency to tear along the stretching directions.

In addition, the stretched piezoelectric sheets 32 and 33 have birefringence. Therefore, when light passing through the piezoelectric sheet 32 or 33 is split into two linear polarized beams orthogonal to each other, a phase difference is caused between the two linear polarized beams. As a result, when an object is seen through the piezoelectric sheet 32 or 33, the image may blur in some cases. However, as in the case of the bimorph type piezoelectric element 31 according to this embodiment, when the piezoelectric sheets 32 and 33 are stacked in such a way that the stretching axes 39 and 40 form an angle of 90 degrees with each other, the phase difference between the two linear polarized beams is eliminated to cause the birefringence of the bimorph type piezoelectric element 31 itself to disappear. Accordingly, when an object is seen through the bimorph type piezoelectric element 31, the image will not blur.

In this embodiment, the piezoelectric sheets 32 and 33 have a rectangular shape, and more particularly, a square shape, one side of each of the piezoelectric sheets 32 and 33 forms an angle of 45 degrees with each of the stretching axes 39 and 40. Therefore, as will be described in detail later, the maximum amplitude can be obtained.

Figure 2:
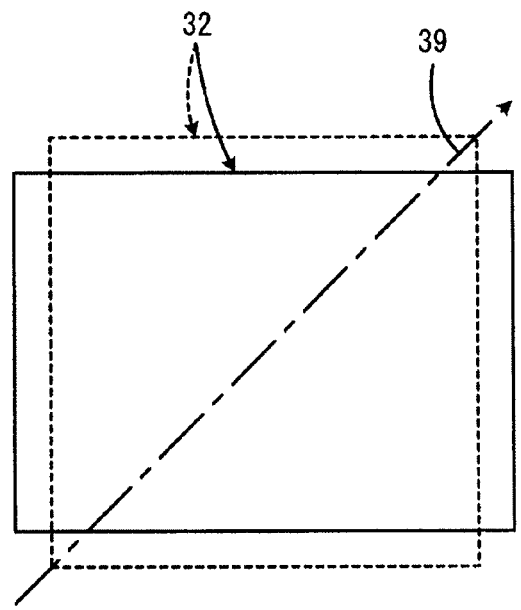
FIG. 2 is a plan view illustrating a deformed mode of a piezoelectric sheet 32 shown in FIG. 1(a) in the case of applying an electric field.

When one of the piezoelectric sheets 32 and 33, for example, only the piezoelectric sheet 32 is picked up, with a voltage applied to keep the electrode 34 at, for example, 0 V and keep the electrode 35 at, for example, 10 V, a deformation is caused as shown in FIG. 2. More specifically, the piezoelectric sheet 32 is deformed from the original state indicated by a dashed line to a state indicated by a solid line in FIG. 2. More simply, the piezoelectric sheet 32 is deformed so as to stretch and contract broadly in a direction with ±45 degrees with respect to the stretching axis 39.

Figure 3:
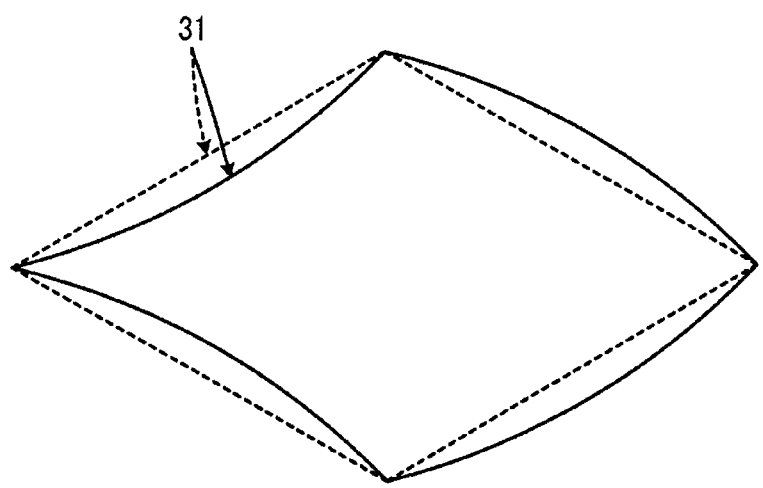
FIG. 3 is a perspective view illustrating a deformed mode of the bimorph type piezoelectric element 31 shown in FIG. 1(a) in the case of applying an electric field.
Figure 4:
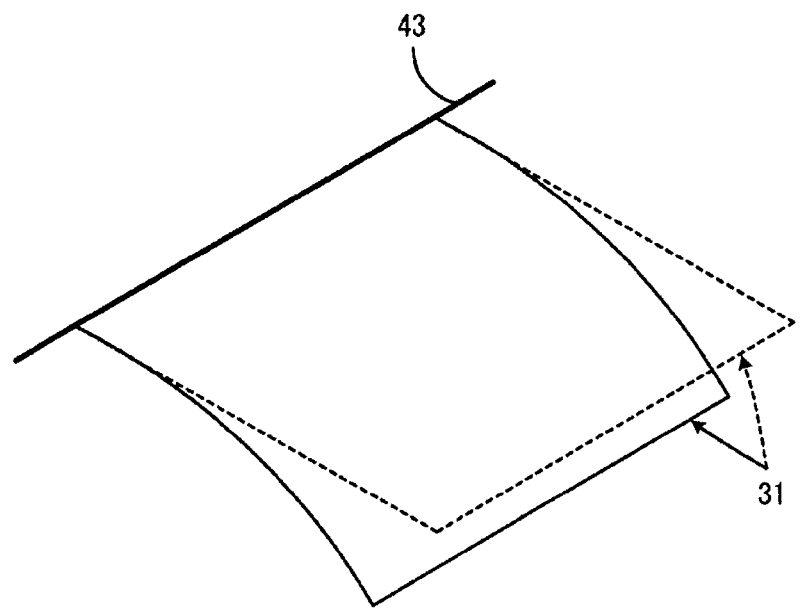
FIG. 4 is a perspective view illustrating a deformed mode with one side of the bimorph type piezoelectric element 31 shown in FIG. 1(a) as a fixed end 43 in the case of applying an electric field.

FIGS. 3 and 4 show a deformation or a vibration of the bimorph type piezoelectric element 31.

The bimorph type piezoelectric element 31 is obtained by attaching the piezoelectric sheet 32 for causing a deformation as shown in FIG. 2 and the piezoelectric sheet 33 for causing a similar deformation to each other, and the stretching axes 39 and 40 of the respective piezoelectric sheets 32 and 33 are orthogonal to each other. For this bimorph type piezoelectric element 31, for example, when a relatively plus electric potential (for example, 10 V) is applied to the electrodes 34 and 36, whereas a relatively minus electric potential (for example, 0 V) is applied to the electrodes 35 and 37, an electric field 41 applied to the piezoelectric sheet 32 has the same direction as that of an electric field 42 applied to the piezoelectric sheet 33 as shown in FIG. 1(c). As a result, when the bimorph type piezoelectric element 31 has four corners fixed, a deformation is caused as shown in FIG. 3. In this condition, with one side of the bimorph type piezoelectric element 31 fixed as a fixed end 43, the bimorph type piezoelectric element 31 causes a deformation as shown in FIG. 4. Then, when an alternating current voltage is applied as the electric fields 41 and 42, the bimorph type piezoelectric element 31 will vibrate.

As can be seen from FIG. 4, the bimorph type piezoelectric element 31 is capable of producing a large amount of displacement. In addition, the problem of the tendency to tear along the stretching axes can be avoided, because the respective stretching axes 39 and 40 of the two dielectric sheets 32 and 33 are oriented in different directions from each other as previously described.

Figure 5:
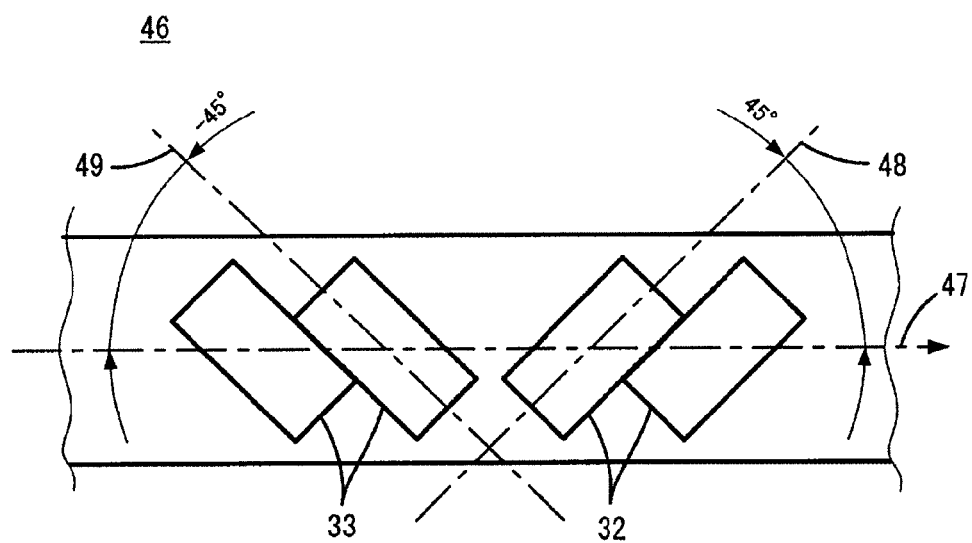
FIG. 5 is a plan view for explaining a preferable method for cutting out the piezoelectric sheets 32 and 33 shown in FIG. 1(b) from a mother piezoelectric sheet 46.

FIG. 5 is a diagram for explaining a preferable method for cutting out the piezoelectric sheets 32 and 33 for the bimorph type piezoelectric element 31 from a mother piezoelectric sheet 46.

FIG. 5 shows the mother piezoelectric sheet 46 with a stretching axis 47 in a plan view. From this mother piezoelectric sheet 46, the one piezoelectric sheet 32 is cut out with its long axis 48 oriented at 45 degrees with respect to the stretching axis 47, whereas the other piezoelectric sheet 33 is cut out with its long axis 49 oriented at −45 degrees with respect to the stretching axis 47. Then, as long as the piezoelectric sheet 32 and piezoelectric sheet 33 cut out in this way are stacked to overlap with each other, the stretching axis 39 of the piezoelectric sheet 32 and the stretching axis 40 of the piezoelectric sheet 33 can be made orthogonal to each other.

It is to be noted that the piezoelectric sheets 32 and 33 cut out from the mother piezoelectric sheet 46 each have a rectangular shape rather than a square shape, in order to determine the direction of stacking the piezoelectric sheet 32 and the piezoelectric sheet 33 without making a mistake. Therefore, in order to obtain the bimorph type piezoelectric element 31 in a square shape as shown in FIG. 1(a), the piezoelectric sheets 32 and 33 may be attached to each other, and then cut to have a square shape. In addition, depending on the cutting mode, bimorph type piezoelectric elements can be obtained which have any shapes other than the rectangle.

As previously described, the maximum amplitude is obtained when one side of the rectangular piezoelectric sheet forms an angle of 45 degrees with respect to the stretching axis, and a study will be made on how the amplitude is changed when the angle between the one side of the piezoelectric sheet and the stretching axis is changed.

Figure 6A:
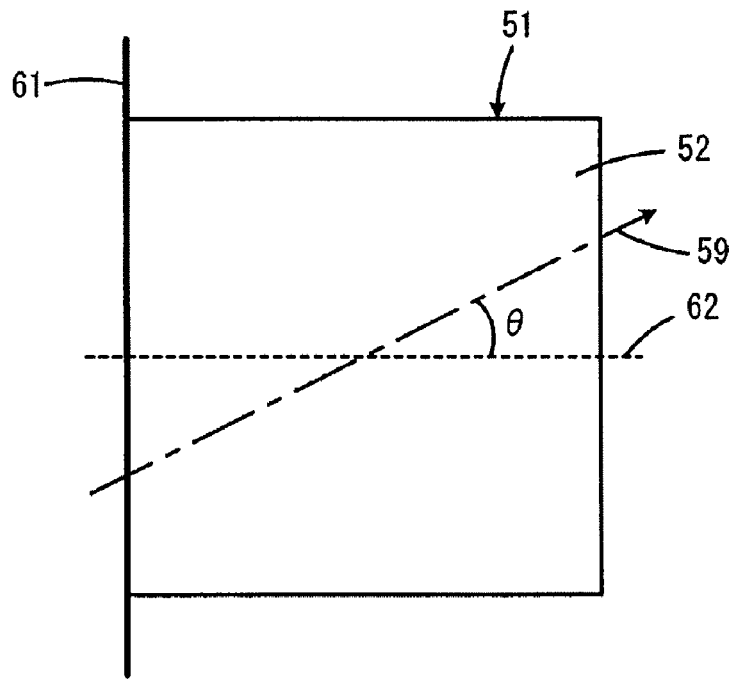
FIGS. 6(a) and 6(b) show a bimorph type piezoelectric element 51 configured by attaching two PLLA sheets 52 and 53 to each other with the directions of their stretching axes aligned, where
Figure 6B:
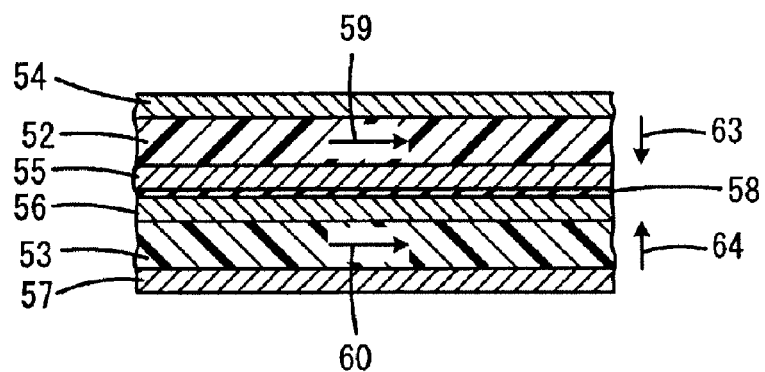

FIGS. 6(a) and 6(b) show a bimorph type piezoelectric element 51 subjected to the study described above, where FIG. 6(a) is a plan view, and FIG. 6(b) is an enlarged cross-sectional view.

The bimorph type piezoelectric element 51 has two PLLA sheets 52 and 53. Electrodes 54 and 55 are formed respectively on each principal surface of the one PLLA sheet 52, whereas electrodes 56 and 57 are respectively formed on each principal surface of the other PLLA sheet 53. In addition, an insulating layer 58 is formed between the electrode 55 and the electrode 56.

In this bimorph type piezoelectric element 51, the respective stretching axes 59 and 60 of the two PLLA sheets 52 and 53 are oriented in the same direction as each other. In this regard, the bimorph type piezoelectric element 51 shown in FIG. 6(a) falls outside the scope of the present invention. It is to be noted that when it is not necessary to distinguish the stretching axis 59 and stretching axis 60 oriented in the same direction from each other, the both are representatively referred to as the "stretching axis 59" in the following description.

Figure 7:
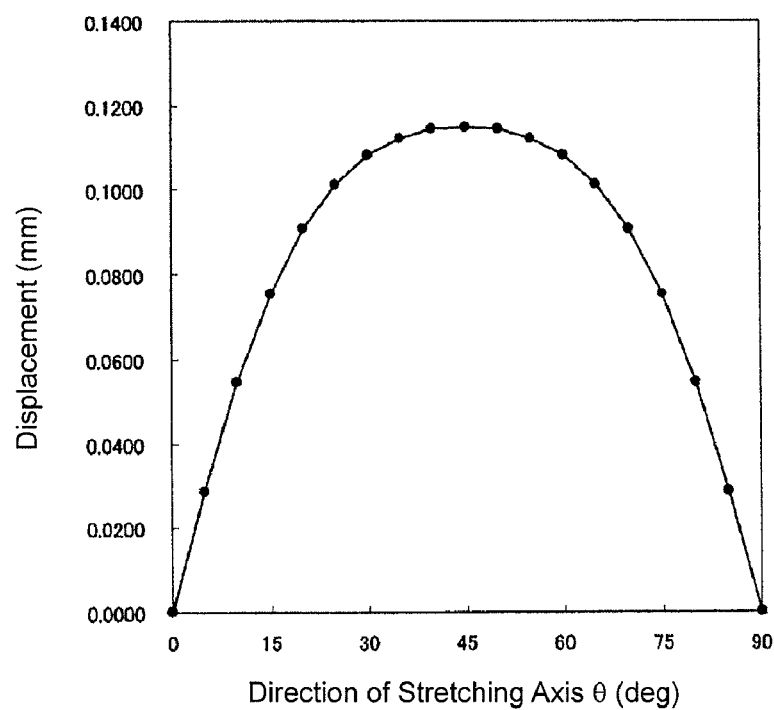
FIG. 7 is a diagram illustrating the relationship between the direction of the stretching axis of and the displacement of the bimorph type piezoelectric element 51 shown in FIG. 6(a).

FIG. 7 shows displacement obtained by performing static analysis calculations in accordance with the finite element method while, with one side of this bimorph type piezoelectric element 51 as a fixed end 61, varying the angle θ formed by a normal 62 for the fixed end 61 and the stretching axis 59 within the range of 0 to 90 degrees. It is to be noted that the angle θ is equal to the angle formed by one side of each of the PLLA sheets 52 and 53 and the stretching axis 59, because the normal 62 extends parallel to one side of each of the PLLA sheets 52 and 53.

The displacement shown in FIG. 7 is displacement obtained in a central portion of the side opposed to the fixed end 61 of the bimorph type piezoelectric element 51. In addition, the PLLA sheets 52 and 53 have a piezoelectric constant $d_{14}$=20 pC/N and dimensions of length×width× thickness=50 mm×50 mm×0.08 mm. In addition, an alternating current voltage of 30 V was applied to the electrodes 54 to 57 in such a way that an electric field 63 applied to the PLLA sheet 52 and an electric field 64 applied to the PLLA sheet 53 are oriented in opposite directions to each other, as shown in FIG. 6(b).

It is to be noted that each of the electrodes 54 to 57 is regarded as an ideal electrode with a thickness of 0.

As can be seen from FIG. 7, the maximum displacement is exhibited when the angle θ formed by the normal 62 and the stretching axis 59 is 45 degrees. In addition, when the angle θ falls within the range of 25 degrees to 65 degrees, about 90% or more of the maximum displacement is ensured. Furthermore, when the angle θ is greater than 0 degrees and less than 90 degrees, the displacement is dramatically increased as compared with the case of 0 degrees or 90 degrees.

While the study described above is indented for cases in which the stretching axes 59 and 60 of the respective two PLLA sheets 52 and 53 are oriented in the same direction as each other, the next study will be made on a case in which the stretching axes 59 and 60 of the respective two PLLA sheets 52 and 53 are oriented in different directions from each other.

Figure 8A:
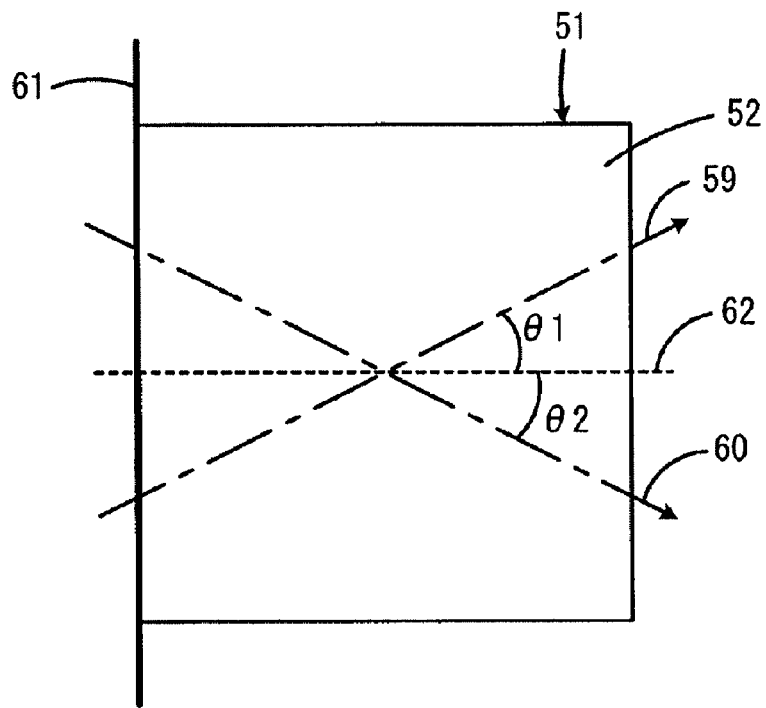
FIGS. 8(a) and 8(b) show a bimorph type piezoelectric element 51 configured by attaching two PLLA sheets 52 and 53 to each other with the directions of their stretching axes varied, where
Figure 8B:
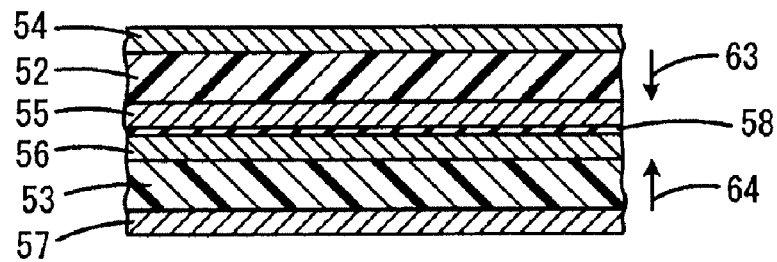
Figure 9:
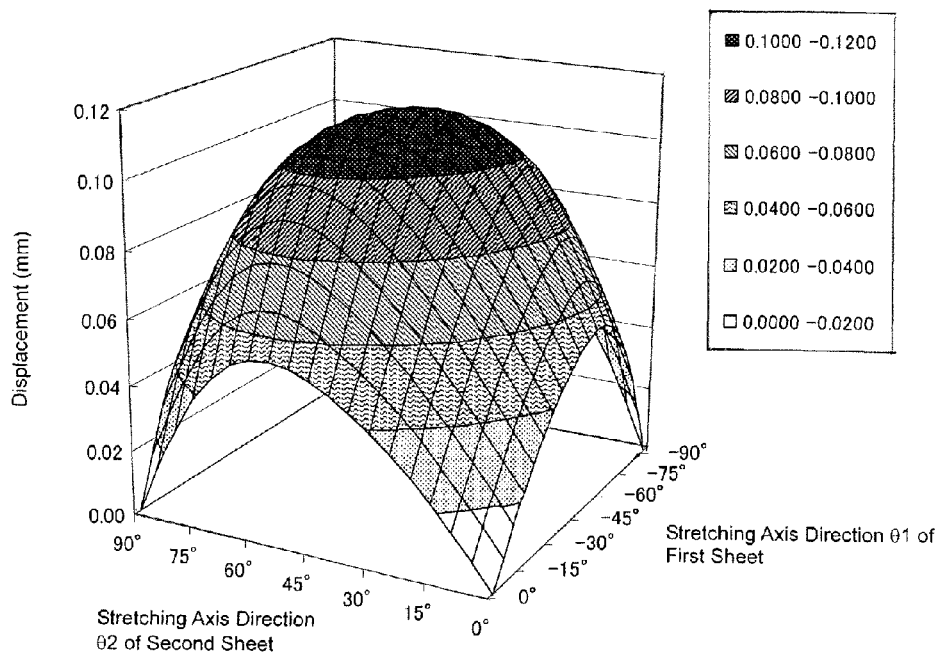
FIG. 9 is a diagram illustrating the relationship between the directions of the stretching axes θ1 and θ2 of and the displacement of the bimorph type piezoelectric element 51 shown in FIG. 8(a).

FIGS. 8(a) and 8(b) are diagrams illustrating a bimorph type piezoelectric element 51 subjected to the study described above, which corresponds to FIG. 6(a). In FIGS. 8(a) and 8(b), the same reference numbers are assigned to elements corresponding to the elements shown in FIGS. 6(a) and 6(b), and overlapped descriptions of the elements will be omitted. As shown in FIG. 8(b), the first PLLA sheet 52 and the second PLLA sheet 53 are stacked in such a way that the stretching axis 59 of the first PLLA sheet 52 forms an angle of θ1 with the normal 62 and the stretching axis 60 of the second PLLA sheet 53 forms an angle of θ2 with the normal 62. For the rest, for the case of applying an alternating current voltage under the same conditions to the bimorph type piezoelectric element 51 configured with the same conditions, as described with reference to FIG. 6(a), FIG. 9 shows the results of static analysis calculations in accordance with the finite element method for the relationships between the angles θ1 and θ and the displacement. In addition, FIG. 10 is a diagram illustrating FIG. 9 in a two-dimensional way.

Figure 10:
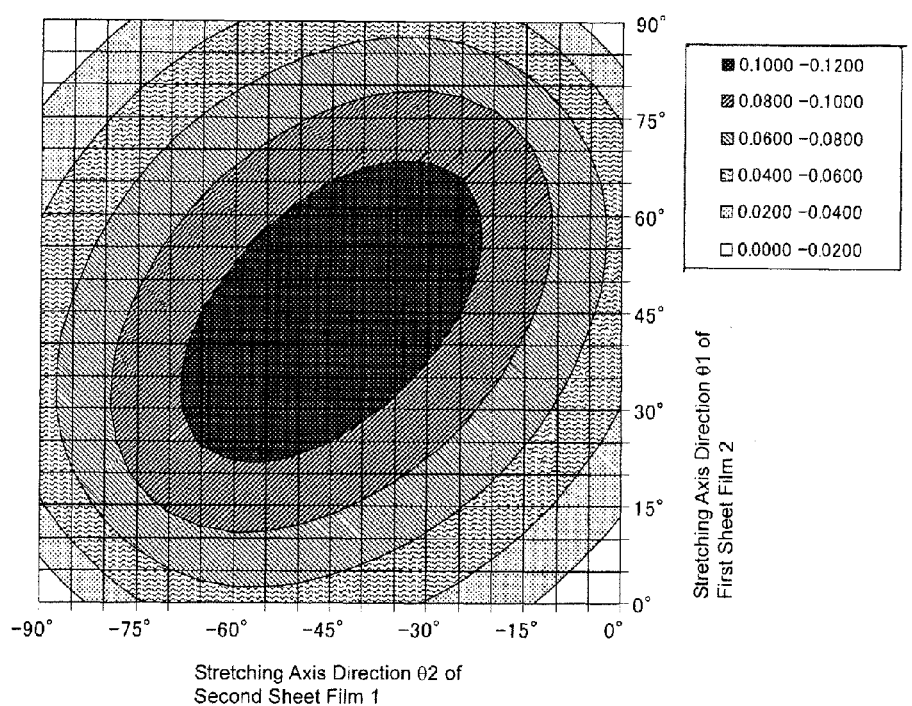
FIG. 10 is a diagram illustrating FIG. 9 in a two-dimensional planar manner.

In FIGS. 9 and 10, the darkest shaded area refers to an area which includes a point indicating the maximum displacement of the bimorph type piezoelectric element 51 and is capable of ensuring about 90% or more of the maximum displacement. The maximum displacement is obtained in the case of θ1=45 degrees and θ2=−45 degrees, and in this case, the angle formed by the stretching axis 59 of the first sheet 52 and the stretching axis 60 of the second sheet 53 is 90 degrees, thus resulting in the bimorph type piezoelectric element 51 also reaching the maximum in terms of strength.

In order to produce efficient displacement or vibration of the bimorph type piezoelectric element 51, an area with larger displacement in FIGS. 9 and 10 may be used. While it is in the case of θ1=45 degrees and θ2=−45 degrees that the maximum displacement is obtained as previously described, a relatively large amount of waste or the inability to cut out a large area may be caused when a piezoelectric sheet for achieving this maximum displacement is cut out from, for example, the mother piezoelectric sheet 46 shown in FIG. 5.

On the other hand, the amount of displacement of the bimorph type piezoelectric element 51 is almost proportional to the magnitude of the voltage applied. Therefore, as long as there is an area which provides about 90% or more of the maximum displacement, it is possible to deal with the lacking amount of displacement by increasing the driving voltage, and typically, it is possible to adequately handle this increase in driving voltage with the use of remaining power from a driving power source.

In order to ensure about 90% or more of the maximum displacement, it is determined from FIG. 10 that what is required is setting the angle θ2 of the second sheet 53 in the stretching axis direction within the range of about −65 degrees to about −25 degrees while setting the angle θ1 of the first sheet 52 in the stretching axis direction within the range of about 25 degrees to about 65 degrees.

When the maximum strength of the bimorph type piezoelectric element 51 is desired while satisfying the conditions described above, what is required is that the relationship of θ2−θ1=90 degrees is further satisfied. On the other hand, for example, in the case of θ1=40 degrees and θ2=−30 degrees, the angle formed by the stretching axis 59 of the first sheet 52 and the stretching axis 60 of the second sheet 53 is 70 degrees, and even in this case, a sufficiently high strength can be obtained as compared with at least the case of the stretching axes aligned.

The ranges of the angles $\theta 1$ and $\theta 2$ will now be considered which can achieve a sufficient strength while achieving about 90% or more of the maximum amplitude.

In FIG. 10, the darkest shaded area has a substantially elliptical shape, and the profile thereof can be approximately represented by the following equations:

$$\theta 1 = 20 \cos t + 12 \sin t + 45 \quad (1)$$

$$\theta 2 = 20 \cos t - 12 \sin t - 45 \quad (2)$$

(where, $0 \leq t < 2\pi$).

The conversion from the equations (1) and (2) into an equation representing the area result in the following:

$$9(\theta 1+\theta 2)^2 + 25(\theta 2-\theta 1+90)^2 \leq 14400 \quad (3)$$

In this case, from the equations (1) and (2), the angle $\theta 1$ and $\theta 2$ are represented as follows:

$$\theta 1 - \theta 2 = -24 \sin t + 90 \quad (4)$$

With $-1 \leq \sin t \leq 1$ obtained from $0 \leq t < 2\pi$ the minimum and maximum of $\theta 1-\theta 2$ are respectively 66 degrees and 114 degrees, and in the case of 114 degrees, the subtraction of 114 degrees from 180 degrees definitely results in the same value as 66 degrees. The value of 66 degrees is sufficiently large as compared with 0 degrees leading to the minimum strength, and thus considered to be an angle at which the problem of the PLLA sheets 52 and 53 tearing along the stretching axes 59 and 60 can be avoided adequately.

Accordingly, the preferable range in terms of amplitude and strength can be said to be present in the area in which the angles $\theta 1$ and $\theta 2$ satisfy the equation (3).

Next, a second embodiment of the present invention will be described.

The displacement of a piezoelectric sheet made of a polylactic acid or the like is increased with increase in electric field intensity applied thereto. While the applied voltage may be increased in order to increase the electric field intensity applied to the piezoelectric sheet, it is difficult to achieve high voltages in the case of mounting the piezoelectric sheet onto a mobile device or the like. Thus, since the electric field intensity is proportional to the voltage and inversely proportional to the distance between electrodes, the electric field intensity onto the piezoelectric sheet is increased when the piezoelectric sheet is reduced in thickness. However, if the piezoelectric sheet is reduced in thickness too much, the strain force of the piezoelectric sheet itself may overwhelmed by the strength of the electrodes, resulting in the inability to achieve desired strain.

On the other hand, the bimorph refers to an element of a stretchable piezoelectric sheet and a contractable piezoelectric sheet stacked for producing displacement, and one bimorph has only one boundary between the stretchable piezoelectric sheet and the contractable piezoelectric sheet. Therefore, it is conceivable that a stack structure made of multiple piezoelectric sheets is adopted for a stretchable piezoelectric sheet section and/or a contractable piezoelectric sheet section in order to increase the strain force of the piezoelectric sheets themselves, even while reducing the piezoelectric sheets in thickness in order to increase the electric field intensity onto the piezoelectric sheets.

Figure 11:
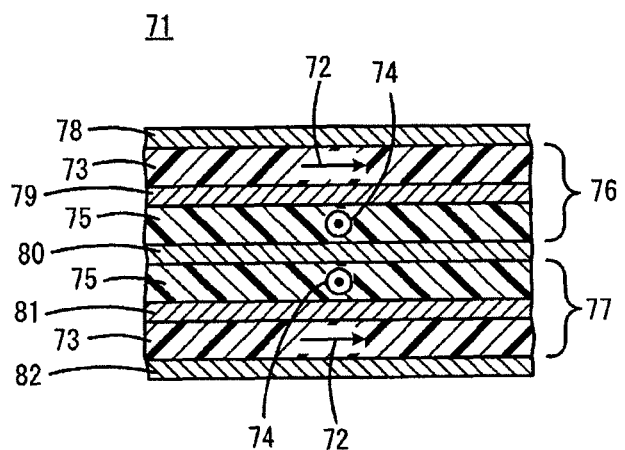
FIG. 11 is a diagram illustrating a bimorph type piezoelectric element 71 according to a second embodiment of the present invention, which corresponds to FIG. 1(c).

FIG. 11, which takes the measure described above, is a diagram illustrating a bimorph type piezoelectric element 71 according to the second embodiment of the present invention, which corresponds to FIG. 1(c).

Referring to FIG. 11, the bimorph type piezoelectric element 71 includes a first piezoelectric sheet 73 with a stretching axis 72 oriented in a first direction and a second piezoelectric sheet 75 with a stretching axis 74 oriented in a second direction different from the first direction. Further, more preferably, the stretching axis 72 and the stretching axis 74 are orthogonal to each other.

While the piezoelectric sheets 73 and 75 described above constitute first and second intermediate laminates 76 and 77, the first piezoelectric sheet 73 and the second piezoelectric sheet 75 are alternately stacked in each case of the first and second intermediate laminates 76 and 77.

The first and second intermediate laminates 76 and 77 are stacked in such a way that the first piezoelectric sheets 73 or the second piezoelectric sheets 75 are adjacent to each other. In the embodiment shown, the first and second intermediate laminates 76 and 77 are stacked in such a way that the second piezoelectric sheets 75 are adjacent to each other.

In addition, electrodes 78 to 82 are respectively formed between the first and second piezoelectric sheets 73 and 75 and on the outward principal surfaces of the first and second piezoelectric sheets 73 and 75. When an electric field is applied to the bimorph type piezoelectric element 71, the electrodes 78, 80, and 82 are kept at the same electric potential as each other, whereas the electrodes 79 and 81 are kept at the same electric potential as each other, which are different from the electric potential for the electrodes 78, 80, and 82.

When the electric field is applied as described above, all of the piezoelectric sheets 73 and 75 of the first intermediate laminate 76 stretch and contract in the same way as each other. On the other hand, all of the piezoelectric sheets 73 and 75 of the second intermediate laminate 77 also stretch and contract in the same way as each other. Then, the piezoelectric sheets 73 and 75 of the first intermediate laminate 76 stretch and contract in the opposite way to the piezoelectric sheets 73 and 75 of the second intermediate laminate 77. As a result, the bimorph type piezoelectric element 71 generally undergoes a deflection with the electrode 80 section as a boundary, and vibrates as a bimorph when an alternating current voltage is applied.

It is to be noted that while each of the first and second intermediate laminates 76 and 77 is made of the two piezoelectric sheets 73 and 75 in the embodiment shown in FIG. 11, at least one of the first and second intermediate laminates 76 and 77 may be made of three or more piezoelectric sheets. In addition, in the case of allowing for serving as a bimorph, while the piezoelectric sheets provided for each of the first and second intermediate laminates desirably have the same thickness as each other, and while the first and second intermediate laminates desirably have the same number of stacked piezoelectric sheets as each other, it is not always necessary to adopt the same thickness and the same number of stacked piezoelectric sheets. In addition, one of the first and second intermediate laminates may be simply made of a single piezoelectric sheet.

According to the embodiment shown in FIG. 11, the electric fields onto each of the piezoelectric sheets 73 and 75 can be increased without increasing the applied voltage, and as a result, both the strain force and the amount of displacement can be increased for each of the piezoelectric sheets 73 and 75 themselves. In addition, an insulating layer corresponding to the insulating layer 38 shown in FIG. 1(c) is not required in this embodiment.

Next, applications of the piezoelectric elements according to the present invention will be described.

For example, the bimorph type piezoelectric element 31 according to the first embodiment as described with reference to FIGS. 1 to 4 causes deformations as described in FIG. 3, and this bimorph type piezoelectric element 31 can be thus attached onto a film made of a stretchable elastomer (for example, an urethane based film, a silicone based film) to allows for serving as a speaker.

Figure 12:
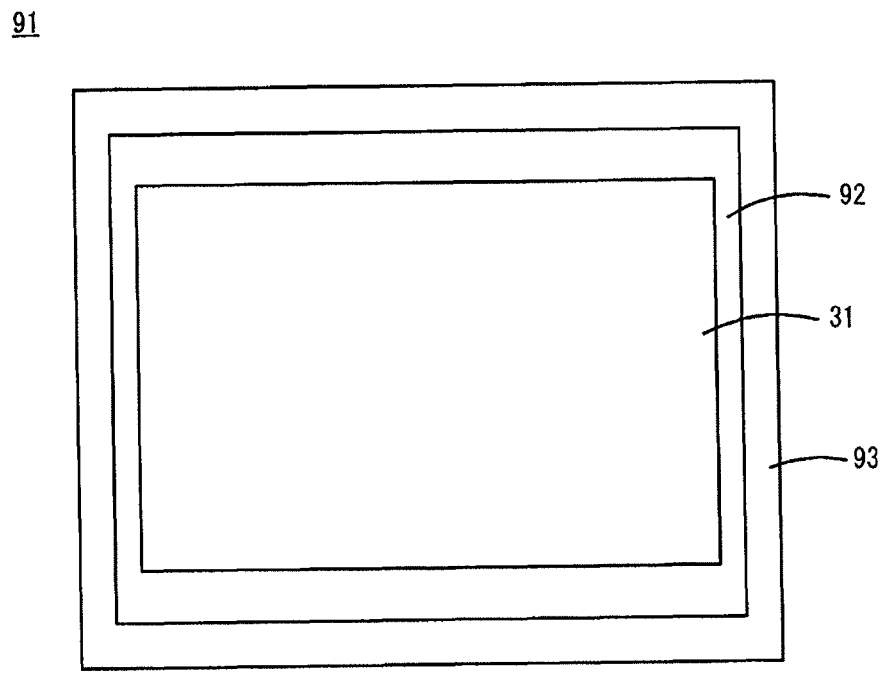
FIG. 12 is a front view illustrating a speaker 91 configured with the use of the bimorph type piezoelectric element 31 shown in FIG. 1(a).

FIG. 12 is a front view illustrating a speaker 91 configured with the use of the bimorph type piezoelectric element 31.

Referring to FIG. 12, the bimorph type piezoelectric element 31 is attached onto a stretchable film 92, and the film 92 is fixed in a fixture section 93 in the shape of a frame.

Figure 13:
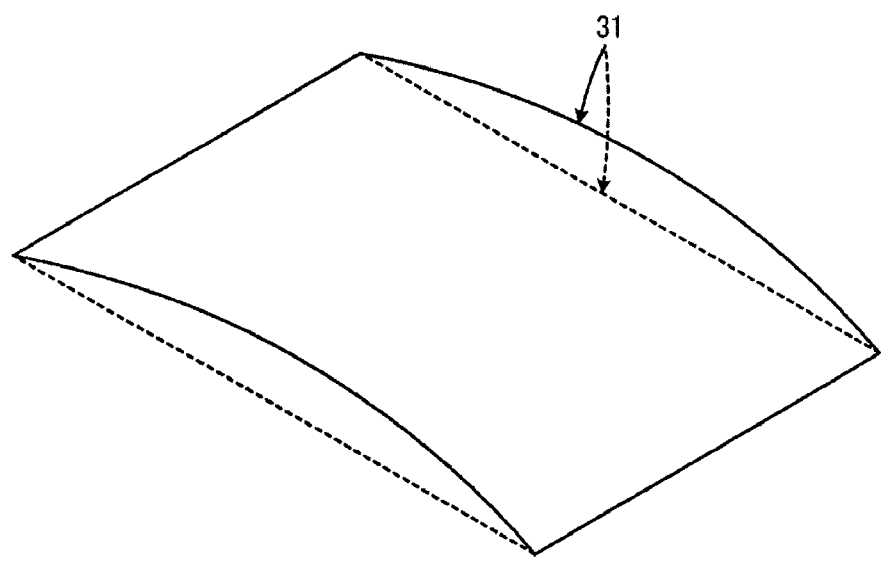
FIG. 13 is a perspective view illustrating a preferable vibration mode of the bimorph type piezoelectric element 31 shown in FIG. 12.

In the speaker 91 described above, when the area of a portion of the stretchable film 92 along the two right and left sides thereof (the dimension in the width direction) is reduced to bring the right and left sides of the bimorph type piezoelectric element 31 closer to the fixture section 93 as shown in FIG. 12, a vibration mode is obtained as shown in FIG. 13, thereby allowing an operation mode preferred for the speaker to be achieved. In FIG. 13, the original state is indicated by a dashed line, whereas the deformed state is indicated by a solid line, as in the case of FIG. 3, etc. described above.

Figure 14:
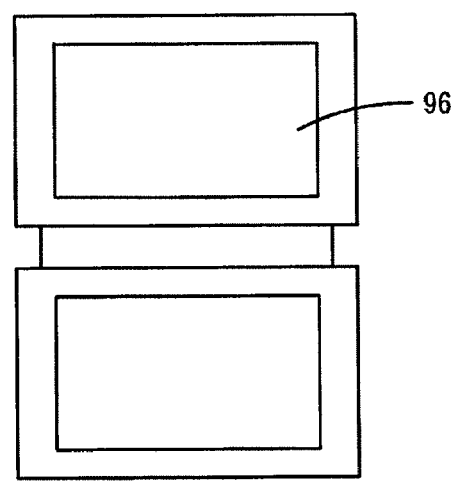
FIG. 14 is a front view illustrating a portable game machine 95 as a preferable application of the speaker 21 shown in FIG. 12.
Figure 15:
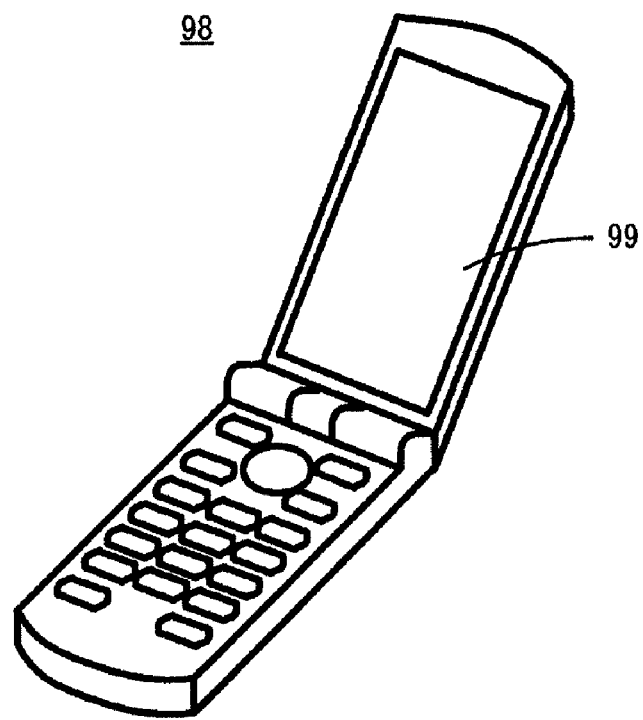
FIG. 15 is a perspective view illustrating a cellular phone 98 as a preferable application of the speaker 91 shown in FIG. 12.

The speaker 91 shown in FIG. 12 can be configured to have transparency, because the bimorph type piezoelectric element 31 can be made transparent as previously described, and the speaker 91 can be totally made transparent because components such as an exciter are not required. Therefore, even when the speaker is placed directly on a display surface 96 of a portable game machine 95 shown in FIG. 14 or a display surface 99 of a cellular phone 95 shown in FIG. 15, the image under the speaker can be made clearly visible. Likewise, the speaker can also be placed on display surfaces of electronic dictionaries, electronic diaries, personal computers, televisions, etc.

In particular, attention should be also paid to the feature that the piezoelectric sheets constituting the piezoelectric element are made of a resin, and thus will not be broken by normal impacts. Therefore, the piezoelectric sheets are advantageously applied in portable devices such as portable game machines and cellular phones. In addition, the piezoelectric sheets made of a resin are flexible, and thus applicable to, for example, paper displays using organic EL, etc.

While it is necessary to increase the speaker in size in order to provide the speaker with a high sound quality, currently available piezoelectric speakers have limitations in this regard because of space limitations to the devices. As described above, according to the present invention, the speaker can be made transparent, which can be placed directly on display surfaces. Therefore, the area of the speaker can be increased to improve the sound quality. In addition, conventional built-in speakers can be eliminated, and as a result, the devices can be reduced in size or new functional components can be built in the spaces with the built-in speakers removed, thereby allowing for enhancement in the performance of the devices.

The speaker made transparent according to the present invention can be advantageously directed to the following applications.

For example, the attachment of the speaker to a window near the priority seat of a train, a bus, or the like also makes it easier for elderly people to listen to announcements in the train, bus, or the like, and moreover, will not cut off the view from the window of the train, bus, or the like.

In addition, in recent years, message cards such as premium Christmas cards have been popular. In these message cards, the speaker can be used as a speaker serving as decoration.

In addition, when the speaker is attached to an advertisement on the wall surface, in particular, a face part of an advertisement with a person arranged to produce the content to be advertised as sounds as if the person were speaking, the interest of people can be attracted to increase the advertising effectiveness. In this case, it is further effective to combine the speaker with an infrared sensor or a Doppler sensor so as to call (stop) people when the people come closer.

Furthermore, it is also possible to form the speaker directly on the surface of a pinball machine or a slot machine, and in such a case, sounds from the entire surface allow for powerful performances.

The present invention can be applied to not only bimorph type piezoelectric elements but also other piezoelectric elements.

Description of Reference Symbols 31, 51, 71 Bimorph type piezoelectric element
32, 33, 73, 75 Piezoelectric sheet
34 to 37, 54 to 57, 78 to 82 Electrode
38, 58 Insulating layer
39, 40, 59, 60, 72, 74 Stretching axis
41, 42, 63, 64 Electric field
52, 53 PLLA sheet
76, 77 Intermediate laminate
91 Speaker
95 Portable game machine
98 Cellular phone

The invention claimed is:

1. A piezoelectric element comprising:
   a plurality of stacked piezoelectric sheets each piezoelectric sheet having a respective predetermined stretching axis and having a main constituent including a helical polymer with a chiral molecule as a unit; and
   electrodes on opposed principal surfaces of each of the piezoelectric sheets, wherein
   at least a first piezoelectric sheet of the plurality of piezoelectric sheets is different from a second piezoelectric sheet of the plurality of piezoelectric sheets in a direction of the respective predetermined stretching axis.

2. The piezoelectric element according to claim 1, wherein the respective predetermined stretching axis of the first piezoelectric sheet of the plurality of piezoelectric sheets forms an angle of 90 degrees with respect to the stretching axis of the second piezoelectric sheet.

3. The piezoelectric element according to claim 1, wherein the plurality of piezoelectric sheets are rectangular.

4. The piezoelectric element according to claim 3, wherein a first side of the first piezoelectric sheet forms an angle of greater than 0 degrees and less than 90 degrees with respect to the respective predetermined stretching axis of the first piezoelectric sheet.

5. The piezoelectric element according to claim 4, wherein the first side of the first piezoelectric sheet forms an angle of 25 degrees or more and 65 degrees or less with the predetermined stretching axis of the first piezoelectric sheet.

6. The piezoelectric element according to claim 5, wherein the first side of the first piezoelectric sheet forms an angle of 45 degrees with the predetermined stretching axis of the first piezoelectric sheet.

7. The piezoelectric element according to claim 1, wherein the first and second piezoelectric sheets are adjacent to each other with respect to a stacking direction and different from each other in a direction of the respective predetermined stretching axis, and the piezoelectric element further comprises an insulating layer between the first piezoelectric sheet and the second piezoelectric sheet, the insulating layer electrically isolating the electrodes on the opposed principal surfaces of the first piezoelectric sheet and the electrodes on the opposed principal surfaces of the second piezoelectric sheet from each other.

8. The piezoelectric element according to claim 1, wherein
the first piezoelectric sheet has the predetermined stretching axis oriented in a first direction and the second piezoelectric sheet has the predetermined stretching axis oriented in a second direction different from the first direction,
the first piezoelectric sheet and the second piezoelectric sheet being alternately stacked to form first and second intermediate laminates, and
the first and second intermediate laminates are stacked such that the first piezoelectric sheets or the second piezoelectric sheets are adjacent to each other.

9. The piezoelectric element according to claim 1, wherein the helical polymer is a polylactic acid.

10. The piezoelectric element according to claim 1, wherein the electrodes contain, as their main constituent, an indium tin oxide, an indium oxide-zinc oxide, or a zinc oxide.

11. The piezoelectric element according to claim 1, wherein the electrodes contain, as their main constituent, a polythiophene.

12. An audio device comprising the piezoelectric element according to claim 1.

* * * * *